PHOTOSENSITIVE COMPOSITION COMPRISING CINNAMOYL AND AZIDO GROUPS

Filed July 2, 1971 2 Sheets-Sheet 1

INVENTORS
AKIRA YABE
MINORU TSUDA
BY HIDEAKI TANAKA
Kurt Kelman
AGENT

INVENTORS
AKIRA YABE
MINORU TSUDA
BY HIDEAKI TANAKA
Kurt Kelman
AGENT

United States Patent Office 3,817,757

Patented June 18, 1974

3,817,757

PHOTOSENSITIVE COMPOSITION COMPRISING CINNAMOYL AND AZIDO GROUPS

Akira Yabe, Yokohama, and Minoru Tsuda and Hideaki Tanaka, Kanagawa, Japan, assignors to Agency of Industrial Science & Technology, Tokyo, Japan Filed July 2, 1971, Ser. No. 159,419
Claims priority, application Japan, Dec. 16, 1970, 45/111,830; Dec. 17, 1970, 45/112,512
Int. Cl. G03c *1/70*
U.S. Cl. 96—115 R 5 Claims

ABSTRACT OF THE DISCLOSURE

A highly photosensitive composition which, owing to the synergistic effect of the cinnamoyl and azido groups, two typical photosensitive groups which are present in its main structure, shows a spectral range sensitivity which is expanded to the long wavelength region, this sensitivity having never been obtained with photosensitive compositions hithertofore available.

DETAILED DESCRIPTION OF THE INVENTION

This invention relates to a highly photosensitive composition which contains two photosensitive groups namely the cinnamoyl and azide groups, and which shows a spectral range of sensitivity expanded to the long wavelength region.

It is well known that photosensitive resins are useful in making printing and photo plates and electronic components as well as in precision metal working. Many kinds of photosensitive resins consisting of high polymeric compounds are known, among which poly(vinyl cinnamate) is used most widely. Poly(vinyl cinnamate) itself is photosensitive in the 220–340 mμ spectral range and is weak in its photosensitivity with respect to practical light sources. Therefore, it has been made suitable for practical uses by adding thereto various kinds of sensitizers to enhance its photosensitivity. A great number of excellent photosensitizers have been discovered for poly(vinyl cinnamate) permitting selective photosensitizing over particular portions of the spectrum. Because poly(vinyl cinnamate) has, from a practical point, excellent physical and chemical properties with respect to the developing process, the dyeing and the drying processes, the stability of its resin solution during storage, its resolution power, the resistance of its film to acid, and the adhesive and dielectric properties of its film, it has become the most practical and effective of the photosensitive resins. However, the wavelength range of photosensitivity created by sensitizers discovered and hithertofore used in practice with poly(vinyl cinnamate) is limited to the ultra-violet region, exposure having been limited to the contact printing method requiring a vacuum frame using a mercury lamp or an arc lamp as light source.

If, therefore, a resin with highly photosensitivity in a spectral range expanded to the long wavelength region should be invented there would be many advantages. It would, for example become possible to use a cheap and convenient light source such as an incandescent lamp, to reduce the exposure time, to record a wide range of colours by using appropriate colouring methods and of realizing image enlargement and image reduction by projection printing through various optical systems.

The main object of the present invention is to provide a highly photosensitive resin which, while conserving the physical and chemical characteristics of photosensitive poly(vinyl cinnamate) resins, presents also a spectral sensitivity range expanded to the long wavelength region. Many new applications can be found for the photosensitive composition provided by this invention, which, compared with photosensitive compositions hitherto used in making photoresists, makes it possible to reduce the exposure time considerably, to use an incandescent lamp as a light source, and to realize image enlargement and image reduction by projection printing with a light passing through various optical systems, and which is also extremely photosensitive towards even visible light.

Other objects and features of this invention will become apparent from the following detailed description given with reference to the accompanying drawings, in which.

Figure 1:
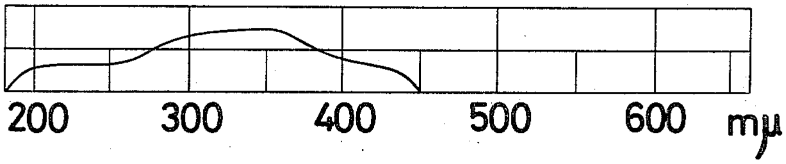
FIG. 1 shows the spectrum of unsensitized poly(vinyl acetate p-azidocinnamate) (co-polymer of vinyl acetate and vinyl p-azidocinnamate).

The photosensitive composition according to the present invention consists of a polymer having the main structural groups (I) attached to the polymer side chains as shown in the formulas (II) or (III), or of a co-polymer having the side chains shown in the formulas (II) or (III) in random combination with side chains of other structural groups.

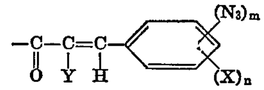

(I)

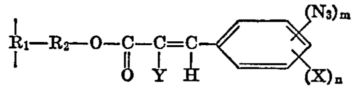

(II)

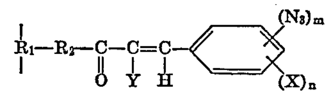

(III)

wherein *m* represents 1 or 2, *n* represents from 0 to 2, X represents one selected from the group consisting of a halogen atom, an alkyl group containing from 1 to 4 carbon atoms, an alkoxy group containing from 1 to 4 carbon atoms, and a nitro group; *y* represents one selected from the group consisting of a hydrogen atom, a halogen atom, a nitro group, and an alkyl group containing from 1 to 4 carbon atoms; $R_1$ represents the main chain of a high polymer and $R_2$ represents the $$—(O—CH_2—CH_2—)_n$$

unit, wherein *n* represents a whole number between 0 and 2 inclusive or a benzene ring.

The photosensitive composition (II) and (III) can be prepared in good yield by usual methods of preparation of poly(vinyl cinnamate). Namely, organic compounds of the structure (II) can be obtained by esterification of a suitable polymer containing a hydroxyl group on the side chain such as, for example, polyvinyl alcohol, polyvinyl alcohol derivatives, co-polymers of vinyl alcohol, poly(vinyl acetate), poly(ethylene glycol), poly(oxystyrene), poly(oxystyrene) derivatives, cellulose, cellulose derivatives with a halide (acid halides) having the structure (I) by the esterification reaction

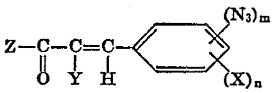
(IV)

(wherein Z represents Cl, Br or I).

Compositions having structure (III) can be obtained by Friedel-Crafts reaction of polymers such as polystyrene, polystyrene derivatives and co-polymers with acid chlorides having structure (IV). They can also be prepared by condensation reaction of a polymer or co-polymer having side chains represented by the general formula (V) with an acid halide having structure (IV).

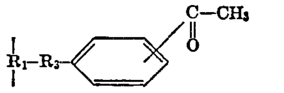
(V)

(wherein $R_1$ represents the polymer main chain, $R_3$ represents an oxygen atom, a $\text{-(O—CH}_2\text{—CH}_2\text{)}_n$ ($n$=0, 1) unit, a

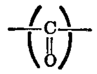

group or a

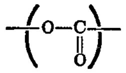

group.

The photosensitive composition (II) or (III) can also be prepared by polymerization of a compound having the following structures:

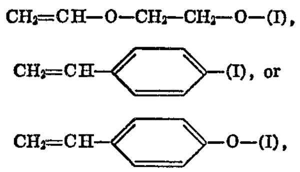

wherein (I) represents a composition having the structure (I) described above.

The most valuable composition among those having the structures (II) and (III) consist of a co-polymer of poly(vinyl cinnamate) and vinyl p-azidocinnamate wherein the content of p-azidocinnamate groups is 10–50 mole percent of that of cinnamate groups. This co-polymer possesses not only the excellent properties of poly(vinyl cinnamate) but also an expanded spectral range of sensitivity, thus providing a highly sensitized photosensitive composition. Moreover, poly(vinyl acetate p-azidocinnamate), and co-polymers of vinyl methoxy cinnamate, vinyl nitro-cinnamate, vinyl succinate or vinyl phthalate with vinyl p-azidocinnamate also provide excellent photosensitive compositions.

Poly(vinyl azidocinnamate) and polymers such as poly (vinyl acetate azidocinnamate) are very soluble in other polymers such as linear chain polyesters, nitrocellulose, novolak, and epoxy resins, and therefore the physical, chemical, thermal and mechanical properties and the supporting structure thereof can be improved by addition of these later polymers. They are also freely soluble at different ratios in poly(vinyl cinnamate) and thus can be used in the form of mixed photosensitive resin.

Furthermore, compositions of a photosensitivity equal to those already described can be formed by replacing the two phenolic hydrogen atoms of the bisphenol groups of (VI) and (VII) with the main structural unit (I).

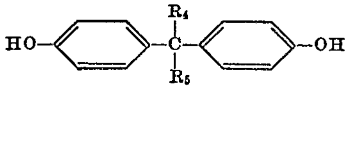
(VI)

(VII)

(wherein $l$ represents a whole number of from 1 to 3 inclusive, $R_4$ and $R_5$ represent hydrogen atoms or alkyl groups having from 1 to 4 carbon atoms).

Photosensitive compositions of this kind are called aromatic bis-azides. The use of these compositions in mixture with high polymer has been described in detail in the U.S. Pat. No. 2,940,853. The present invention provides new compounds quite different from the aromatic bis-azides described in the patent cited above, and the present compounds can be easily prepared in high yield. They can be obtained in the same way as those previously described, by esterification of an acid chloride (IV) with a bisphenol (VI) or (VII), with a yield superior to 80%. In particular, this esterification is carried out at a low temperature, in the vicinity of 0° C., for about one hour in the aqueous alkaline process so as to quantitatively obtain an ester. In addition, as raw materials bisphenol groups are inexpensive and widely used in industry. Mixing of these bis-azides with solutions of polymers, for example, with solutions of such soluble rubbers as natural rubber, cyclized rubber, styrene-butadiene rubber, chloroprene rubber, isoprene rubber, and nitrile rubber, or with solutions of novolak, polystyrene of soluble nylon, in ratios of over 0.1% and preferably between 0.5 to 1.0% of the polymer weight, gives photosensitive resin. When the above rubbers are used as polymers serving as a binder, the photosensitive resin produces a photosensitive film superior in resistance to chemicals, which can be put into practical use in the electronic industry. Alternatively, in the case of using novolak, nylon and the like as polymers, the resulting photosensitive resin can be employed as printing plates.

The photosensitive compositions according to this invention are highly photosensitive even without any sensitizer, but their spectral sensitivity can be further enhanced by numerous sensitizers which have been used with ordinary photosensitive resins. Namely, the spectral sensitivity can be enhanced by aromatic amines such as p-nitrodiphenyl, picramide, 2,6-dichloro-4-nitro-ariline, 4-nitro-1-naphthylanine and 5-nitroacenaphthene, aromatic nitro compounds, aromatic ketones such as dibenzalacetone, Michler's ketone and thio-Michler's ketone, quinones such as 1,2-benzanthraquinone and anthraquinone, anthrones such as 1,9-benzanthrone, or xanthene dyes such as eosine and iodo-eosine. For example, poly(vinyl p-azidocinnamate) is sensitized by 5-nitroacenaphthene, or 1,2-benzanthraquinone to have its sensitivity expanded to about 520 mμ, by thio-Michler's ketone and iodo-eosine to about 600–670 mμ. The composition provided by this invention are fairly more sensitized to a considerably higher degree by a given sensitizer than is poly(vinyl cinnamate). It is clear, from the theory of spectral sensitizing mechanism, that by finding sensitizers more suitable to the present compositions, it will be possible to expand the photosensitivity to much longer wavelengths and to considerably strengthen the sensitizing effect.

The following are examples of preferred embodiments of this invention, but they are not to be considered as limitative.

EXAMPLE 1

Methyl ethyl ketone (30 ml.) and toluene (8 ml.) were added to p-azidocinnamoyl chloride (6 g.). The mixture was cooled to about −5° C. On the other hand, an aqueous solution (30 ml.) of polyvinyl alcohol (52 g./l.) which had a degree of polymerization of 1700 and a saponification value of 81.5 mole percent was added with continual stirring with an aqueous solution of sodium hydroxide (5 g./30 ml.), then with methyl ethyl ketone (30 ml.). The mixture was cooled to −5° C., and a solution of p-azidocinnamoyl chloride previously prepared was added thereto. The mixture was kept at 0∼ −5° C. while stirring was continued for about 90 min. The reaction mixture was then left standing at room temperature. An upper layer of methyl ethyl ketone appeared and was separated out. This solution could be used as photosensitive poly (vinyl p-azidocinnamate) resin according to this invention.

EXAMPLE 2

The product obtained in Example 1 was dissolved to 2% by weight in a 1:2 mixture of methyl ketone and cyclohexanone. The resulting solution was painted on a quartz glass and then measured by a spectrosensitometer (500 w. xenon light source) to observe its spectral sensitivity. This measurement disclosed that the peak of spectral sensitivity was 316 mμ and that the minimum light energy required for making the polymer insoluble was less than 500 erg/cm.$^2$.

Table 1 shows a comparison of this photosensitive resin with poly(vinylcinnamate), poly(vinyl p-azidobenzoate), poly(vinyl cinnamylideneacetate) and the like. As is clear from Table 1, poly(vinyl p-azidocinnamate) of the present invention requires the least light energy for making the polymer insoluble and is the most sensitive, when compared with conventional photosensitive resins of this kind.

TABLE 1

| Photosensitve polymer | Peak of spectrosensitivity, mμ | Light energy required for making polymer insoluble, erg/cm.$^2$ |
|---|---|---|
| Poly(vinyl p-azidocinnamate) | 316 | <490 |
| Poly(vinyl cinnamate) | 278 | 4,100 |
| Poly(vinyl p-azidobenzoate) | 274 | 5,700 |
| Poly(vinyl cinnamylideneacetate) | 306 | <2,400 |

EXAMPLE 3

A solution of polyvinyl alcohol (50 ml.) was prepared in the same way as in Example 1. After addition of an aqueous solution of sodium hydroxide (8 g./50 ml.), and methyl ethyl ketone (50 ml.) it was cooled to 0~ −3° C. To this mixture, a solution of toluene (12 ml.) and methyl ethyl ketone (50 ml.) containing p-azidocinnamoyl chloride (2 g.), cooled to 0~ −3° C. was introduced and stirring was continued for about 90 min.

The reaction mixture was left standing at room temperature. The upper layer of methyl ethyl ketone solution could be used as thus prepared, as a photosensitive poly(vinyl p-azidocinnamate). This photosensitive solution was painted on a quartz glass and then measured by a spectrosensitometer (500 w. xenon light source). FIG. 1 shows the spectral sensitivity of the photosensitive film. In this figure light intensity is plotted on the ordinate axis from higher to lower intensity in the upward direction As shown in FIG. 1, the photosensitivity is in the range of from 200 to 450 mμ, which is nearly equal to that of the composition obtained by sensitizing poly(vinyl cinnamate) with 5-nitroacenaphthene.

Even when the photosensitive composition of this invention has not been subjected to sensitization, the sensivity extends far into the long wave length portion. In addition, the sensitivity on respective wave length portions of this composition is higher than that of the poly(vinyl cinnamate).

EXAMPLE 4

A methyl ethyl ketone solution containing 3% of the photosensitive poly(vinyl p-azidocinnamate) resin obtained in Example 1 was mixed with the same quantity of a methyl ethyl ketone-cyclohexanone mixture containing 3% of poly(vinyl cinnamate) photosensitive resin. The product was exposed to a 100 w. ultra-high pressure mercury lamp at a distance of 25 cm. for 30 sec. through the Kodak Step Tablet No. 2, with the result that the plate showed 12 steps.

EXAMPLE 5

The product obtained in Example 3 was dissolved (2% in concentration) in a mixture of methyl ketone, cyclohexanone 2:1. The solution was painted on a glass plate which after being dried was exposed for 30 sec. to the light of a 100 w. ultra-high pressure mercury lamp through a No. 2 Kodak Step Tablet at a distance of 25 cm. from the lamp. The plate was developed by immersion in a 1:1:1:3 mixture of toluene, xylene, cellosolve acetate, and methyl ethyl ketone for 1–2 min. It showed 12 steps.

Figure 2:
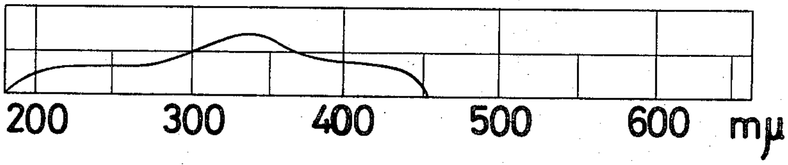
FIG. 2 shows the spectrum of unsensitized poly(vinyl p-azidocinnamate) (co-polymer of vinyl cinnamate and vinyl p-azidocinnamate co-polymer).
Figure 3:
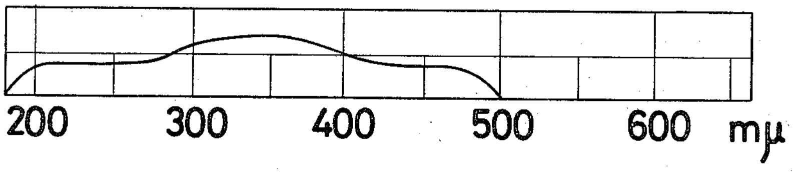
FIGS. 3 to 6 show the spectra of poly(vinyl acetate-p-azidocinnamate) (co-polymer of vinyl acetate and vinyl p-azidocinnamate) sensitized by addition thereto of 4 kinds of sensitizers.
Figure 4:
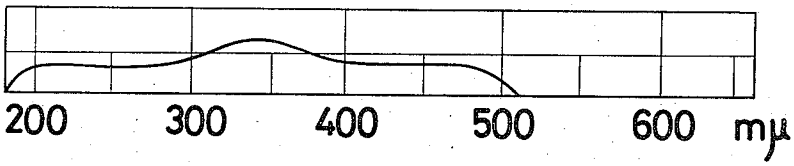
Figure 5:
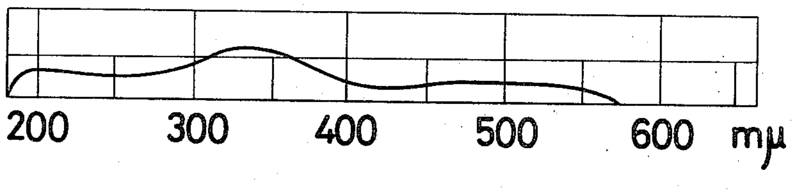
Figure 6:
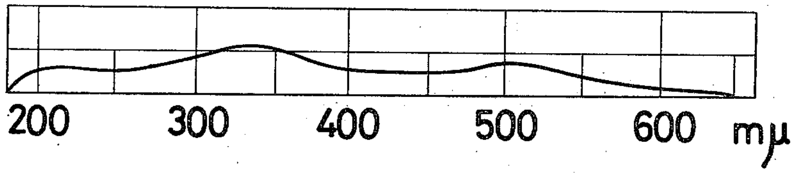

Observation of photosensitive film laid on a quartz glass by a spectrosensitometer (500 w. xenon light source) gave the spectra shown in FIG. 2. FIG. 2 shows that even though the composition had not been subjected to sensitization in the same way as in Example 3, it had remarkably high sensitivity.

EXAMPLE 6

Polyvinyl Acetate (degree of polymerization 1900, hydroxyl content 44% mole percent) (5 g.) was dissolved in dry pyridine (100 ml.). To this solution p-azidocinnamoyl chloride (6.6 g.) was introduced, the mixture was stirred for about 4 hours at 45–50° C. The reaction solution was dropped into alcohol to extract the resin, which could be used as a photosensitive composition of poly(vinyl acetate p-azidocinnamate), which is soluble in organic solvents such as methyl ethyl ketone or cyclohexanone.

The product was exposed to 100 w. ultra-high pressure mercury lamp at a distance of 25 cm. for 30 sec. through the Kodak Step Tablet No. 2, with the result that the plate showed 12 steps.

EXAMPLE 7

To the product obtained in example 6 were added various sensitizers (at 10% of polymer weight). The photosensitivity of these samples was observed with a 100 w. ultra-high pressure mercury lamp. The relative sensitivity is listed in Table 2, together with the value of poly(vinyl cinnamate) for comparison.

TABLE 2

| Photosensitive composition | Sensitizer | Relative sensitivity |
|---|---|---|
| Poly(vinyl cinnamate) | Unsensitized | 0~2.2 |
| | 5-nitroacenaphthene | 1,100 |
| Poly(vinyl p-azidocinnamate) | Unsensitized | 11,000 |
| | 5-nitroacenaphthene | 56,000 |
| | 1,2-benzanthraquinone | 56,000 |
| | Thio-Micheler's-ketone | 11,000 |

The observed spectra of sensitivity obtained with a spectrosensitometer are shown in FIGS. 3–6. The spectrum shown in FIG. 3 corresponds to a sample sensitized by 5-nitroacenaphthene, FIG. 4, FIG. 5 and FIG. 6 correspond to samples sensitized by 1,2-benzanthraquinone, thio-Michler's ketone, and iodoeosine, respectively.

The same results regarding relative sensitivity, and spectral sensitivity were observed for sensitized samples of the product obtained in Examples 1 and 3. As shown in FIGS. 3 to 6, the photosensitive composition of the present invention to which different kinds of sensitizer have been added extends with remarkable efficiency its sensitivity to the long wave length portion. In particular, with the aid of iodo-eosine, the photosensitive composition has a sensitivity of 670 mμ a value which could not be attained by conventional photosensitive compositions.

EXAMPLE 8

A 2:1 mixture of methyl ethyl ketone and cyclohexanone containing 5% of the product obtained in Example 6 was added to an equal amount (1:1) of 1:1 mixture of methyl ethyl ketone and cyclohexanone containing 5% of poly(vinyl cinnamate). The solution was applied on a glass plate and exposed to the light of a 100 w. ultra-light pressure mercury lamp at a distance of 25 cm. for 30 sec. At the end of the test, the plate showed 12 steps of the Kodak Step Tablet.

EXAMPLE 9

To the products obtained in Examples 3 and 6 were added 10 weight percent of 5-nitroacenaphthene and of iodo-eosine. A 2% solution of the mixture in methyl ethyl ketone-cyclohexanone was applied on a glass plate and dried. Exposure of this plate to projection printing using an enlarger provided with a 1:28, $f$=50 m./m. lens and with a 200 w. incandescent lamp gave a picture of an original printed circuit enlarged ten times. Exposure was carried out for 2 min. The developing process was similar to that of Example 5. Dyeing with Kodak KPR dye gave a clear thin film picture.

EXAMPLE 10

As illustrated in Example 6, polyvinyl acetate (5 g.) was dissolved in dry pyridine (100 ml.), to the mixture was added m-azidocinnamoyl chloride (7.2 g.). The reaction was carried out in the same manner as above. The product was dropped into a large amount of water or alcohol. Photosensitive composition of poly(vinyl acetate m-azidocinnamate) was obtained, it was soluble in methyl ethyl ketone and Cellosolve acetate. The product underwent a Step Tablet test using a 100 w. ultra-high pressure mercury lamp, with the result that the plate showed 8 steps.

EXAMPLE 11

Novolak (5 g.) was dissolved in an aqueous solution of sodium hydroxide (8 g./50 ml.). The mixture was added with methyl ethyl ketone (40 ml.) and kept at −5° C. To this was introduced a solution containing p-azidocinnamoyl chloride (4 g.) and cinnamoyl chloride (3 g.) in methyl ethyl ketone (40 ml.), cooled to −5° C. Stirring was continued for about 90 min. The reaction mixture was left standing at room temperature. The upper layer of methyl ethyl ketone solution was separated out. This solution could be used as the photosensitive resin formed by an ester of novolak p-azidocinnamate-cinnamate. The product underwent a Step Tablet test using a 100 w. ultra-high pressure mercury lamp, with the result that the plate showed 8 steps.

EXAMPLE 12

Bisphenol A (5.7 g.) was dissolved in a mixture of methyl ethyl ketone (50 ml.) with an aqueous solution containing 8 g. of sodium hydroxide. The product was cooled to 0° C. It was added with a mixture of methyl ethyl ketone (58 ml.) and toluene (12 ml.) containing p-azidocinnamoyl chloride (12 g.) and stirred continuously for 1 hour. The precipitate was separated from the reaction solution by filtration, washed with water and alcohol. Bis-azide having the following structure was obtained (Yield: 14 g.)

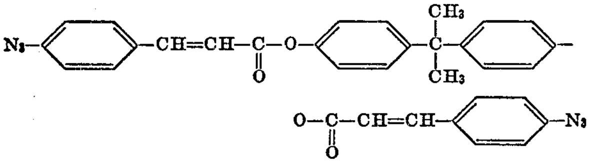

EXAMPLE 13

Figure 7:
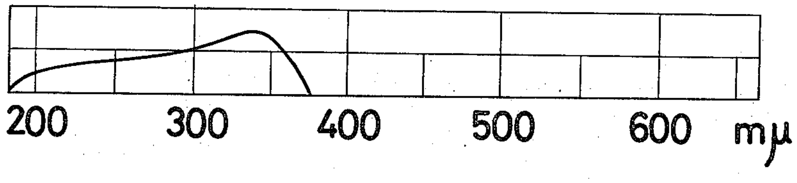
FIG. 7 shows the spectra of the unsensitized photosensitive resin obtained by compounding 2 photosensitive compounds provided by this invention with cyclicised rubber.

Dissolving 3 g. of bis-azide prepared in Example 11 in 4 l. of toluene-xylene 1:1 mixture containing 2.5% of styrene-butadiene rubber gave a product which can be used as photosensitive resin in the usual way. The sensitivity spectrum of this photosensitive solution is shown in FIG. 7.

EXAMPLE 14

Figure 8:
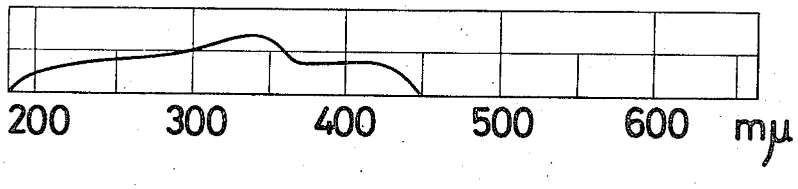
FIG. 8 shows the spectra of the sensitized photosensitive resin obtained by adding 5-nitroacenaphthene as sensitizing agent to the unsensitized photosensitive resin mentioned above in connection with FIG. 7.

Adding 0.7% of 5-nitroacenaphthene to the photosensitive solution obtained by mixing together 3 g. of the bis-azide prepared in Example 11, with styrenebutadiene rubber (100 g.), toluene (2 l.), and xylene (2 l.), gave a photosensitive resinic solution which, when subjected to the usual test for sensitivity for 30 seconds showed 12 steps of the Kodak Step Tablet. The sensitivity spectrum of this sensitized photosensitive resin is shown in FIG. 8.

We claim:

1. A photosensitive composition which comprises in combination:

(A) a photosensitive component of the formulae:

(1)

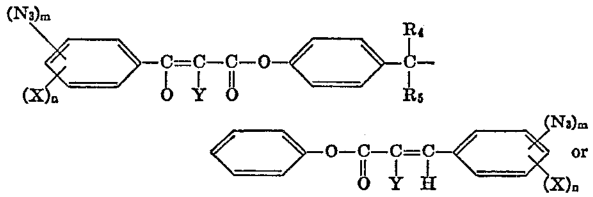

(2)

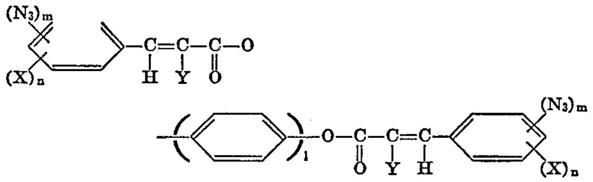

wherein $m$ represents 1 or 2; $n$ represents from 0 and 2; X represents a member selected from the group consisting of a halogen, alkyl group containing from 1 to 4 carbon atoms, alkoxy group containing from 1 to 4 carbon atoms and nitro; Y represents a member selected from the group consisting of hydrogen, halogen, nitro, and an alkyl group containing from 1 to 4 carbon atoms; $l$ represents a whole number from 1 to 3 inclusive; and $R_4$ and $R_5$ represent hydrogen or alkyl group containing from 1 to 4 carbon atoms; and (B) a solution of a soluble polymer.

2. The photosensitive composition according to claim 1 wherein said solution of a soluble polymer is one wherein the soluble polymer is a member selected from the group consisting of natural rubber, cyclized rubber, styrene-butadiene rubber, chloroprene rubber, isoprene rubber, nitrile rubber, novolak, polystyrene and soluble nylon.

3. A photosensitive composition which comprises in combination:

(A) a photosensitive component of the formulae:

(1)

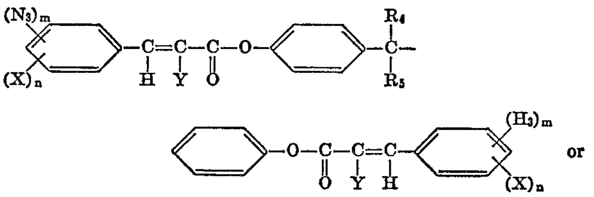

(2)

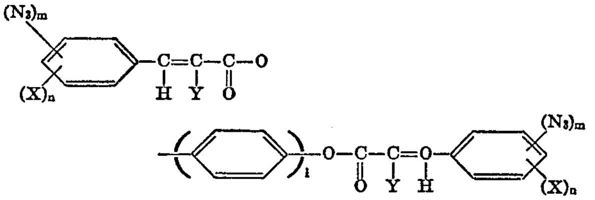

wherein $m$ represents 1 or 2; $n$ represents from 0 and 2; X represents a member selected from the group consisting of a halogen, alkyl group containing from 1 to 4 carbon atoms, alkoxy group containing from 1 to 4 carbon atoms and nitro; Y represents a member selected from the group consisting of hydrogen, halogen, nitro, and an alkyl group containing from 1 to 4 carbon atoms; $l$ represents a whole number from 1 to 3 inclusive; and $R_4$ and $R_5$ represent hydrogen or alkyl group containing from 1 to 4 carbon atoms;

(B) a solution of a soluble polymer; and (C) a sensitizer.

4. The photosensitive composition according to claim 3 wherein said solution of a soluble polymer is one wherein the soluble polymer is a member selected from the group consisting of natural rubber, cyclized rubber, styrene-butadiene rubber, chloroprene rubber, isoprene rubber, nitrile rubber, novolak, polystyrene and soluble nylon.

5. The photosensitive composition according to claim 3, wherein said sensitizer is one member selected from the group consisting of aromatic amines, aromatic nitro compounds, aromatic ketones, guinones, anthrones and xanthene dyes.

References Cited

UNITED STATES PATENTS

| | | | |
|---|---|---|---|
| 3,475,176 | 10/1969 | Rauner | 96—9 IN |
| 3,591,378 | 7/1971 | Altman | 96—9 IN |
| 3,615,538 | 10/1971 | Peters et al. | 96—9 IN |

RONALD H. SMITH, Primary Examiner

U.S. Cl. X.R.

96—35.1, 9 IN, 115 P